(12) United States Patent
Kelly et al.

(10) Patent No.: US 8,703,556 B2
(45) Date of Patent: Apr. 22, 2014

(54) METHOD OF MAKING A FINFET DEVICE

(75) Inventors: Andrew Joseph Kelly, Hengshan Township, Hsinchu County (TW); Po-Ruwe Tzng, Kaohsiung (TW); Pei-Shan Chien, Keelung (TW); Wei-Hsiung Tseng, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/599,393

(22) Filed: Aug. 30, 2012

(65) Prior Publication Data

US 2014/0065782 A1     Mar. 6, 2014

(51) Int. Cl.
*H01L 21/00* (2006.01)

(52) U.S. Cl.
USPC ........... 438/157; 257/296; 257/316; 257/330; 257/332; 257/334; 257/347; 257/369; 257/390; 257/401; 438/144; 438/149; 438/151; 438/197; 438/211; 438/230; 438/254; 438/264; 438/270; 438/283

(58) Field of Classification Search
CPC ............ H01L 29/785; H01L 29/66795; H01L 29/6681; H01L 29/66818; H01L 29/66803
USPC ......... 257/296, 316, 327, 328, 330, 332, 334, 257/347, 369, 390, 401; 438/144, 149, 151, 438/157, 197, 211, 230, 254, 264, 270, 272, 438/280, 283
See application file for complete search history.

(56) References Cited

U.S. PATENT DOCUMENTS

| | | | | |
|---|---|---|---|---|
| 7,074,662 | B2 * | 7/2006 | Lee et al. | 438/199 |
| 2011/0210404 | A1 * | 9/2011 | Su et al. | 257/401 |
| 2013/0187228 | A1 * | 7/2013 | Xie et al. | 257/347 |
| 2013/0285129 | A1 * | 10/2013 | Jensen et al. | 257/288 |

OTHER PUBLICATIONS

Unpublished U.S. Appl. No. 13/425,218, filed Mar. 20, 2012 entitled "FinFET with Metal Gate Stressor" 31 pages.

* cited by examiner

*Primary Examiner* — Kyoung Lee
*Assistant Examiner* — Ratisha Mehta
(74) *Attorney, Agent, or Firm* — Haynes and Boone, LLP

(57) ABSTRACT

A FinFET device is fabricated by first receiving a FinFET precursor. The FinFET precursor includes a substrate and fin structures on the substrate. A sidewall spacer is formed along sidewall of fin structures in the precursor. A portion of fin structure is recessed to form a recessing trench with the sidewall spacer as its upper portion. A semiconductor is epitaxially grown in the recessing trench and continually grown above the recessing trench to form an epitaxial structure.

20 Claims, 13 Drawing Sheets

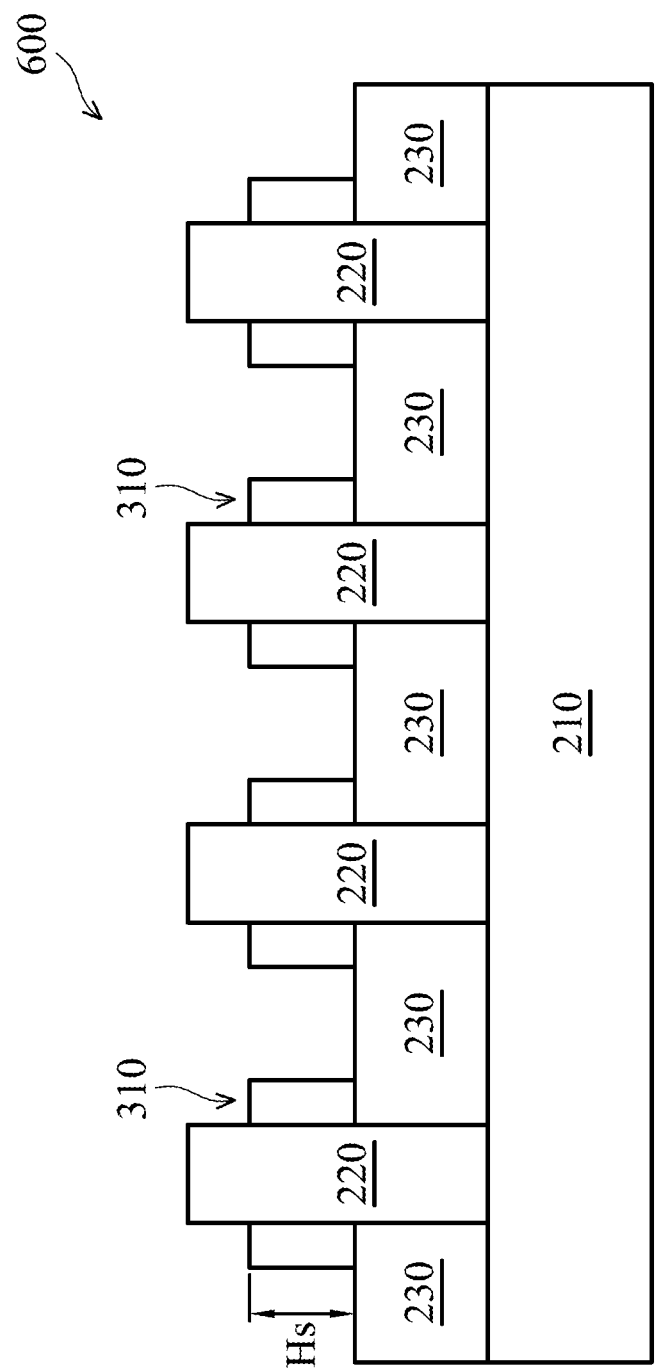

METHOD OF MAKING A FINFET DEVICE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a variation of height and width of source/drain epitaxial structures raise challenges in a FinFET process development. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B, 5B, 6B, 7A, 7B and 7C illustrate cross sectional views of a FinFET device along line B-B in FIG. 2.

DETAILED DESCRIPTION

Figure 1:
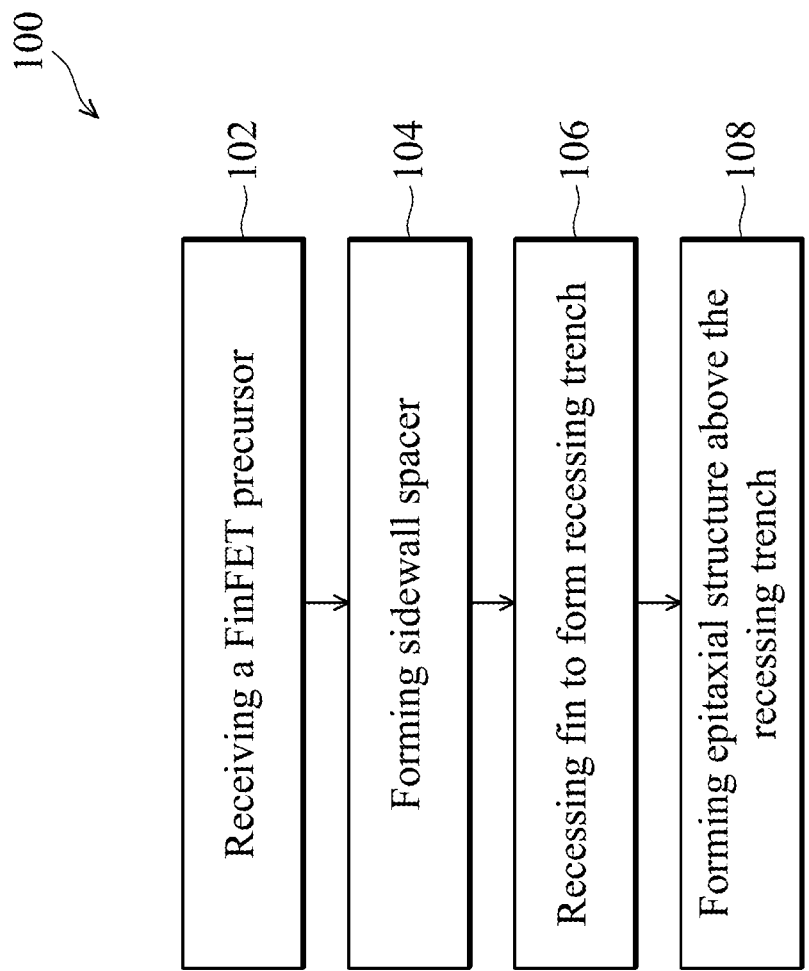
FIG. 1 is a flow chart of an example method for fabricating a FinFET device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Examples of devices that can benefit from one or more embodiments of the present application are semiconductor devices. Such a device, for example, is a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present application. It is understood, however, that the application should not be limited to a particular type of device, except as specifically claimed.

Figure 2:
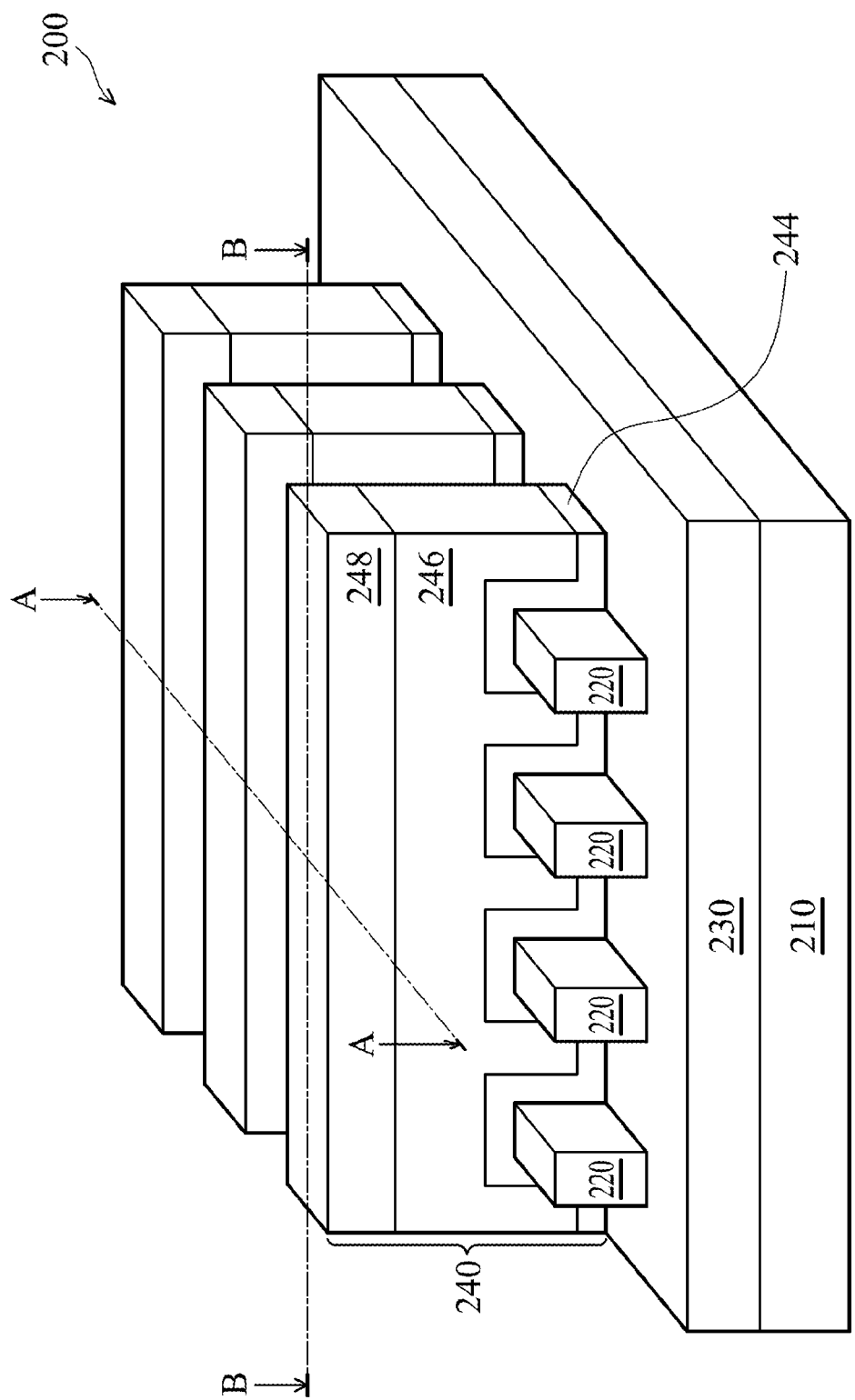
FIG. 2 is a top view of a FinFET precursor according to various aspects of the present disclosure.

FIG. 1 is a flowchart of a method for fabricating a FinFET device 600 according to aspects of the present disclosure. FIG. 2 is a top-side view of a FinFET precursor 200. Referring to FIG. 2, cross section views of the FinFET precursor 200 and FinFET device 600 are taken along lines of A-A and B-B. FIGS. 3A, 4A, 5A and 6A are cross section views along the line A-A of FIG. 2. FIGS. 3B, 4B, 5B, 6B, 7A, 7B and 7C are cross section views along the line B-B of FIG. 2 and perpendicular to the direction of the line of A-A. The method 100, the FinFET precursor 200 and the FinFET device 600 are collectively described with reference to FIG. 1 through FIG. 7. It is understood that additional steps can be provided before, during, and after the method 100, and some of the steps described can be replaced or eliminated for other embodiments of the method.

Figure 3A:
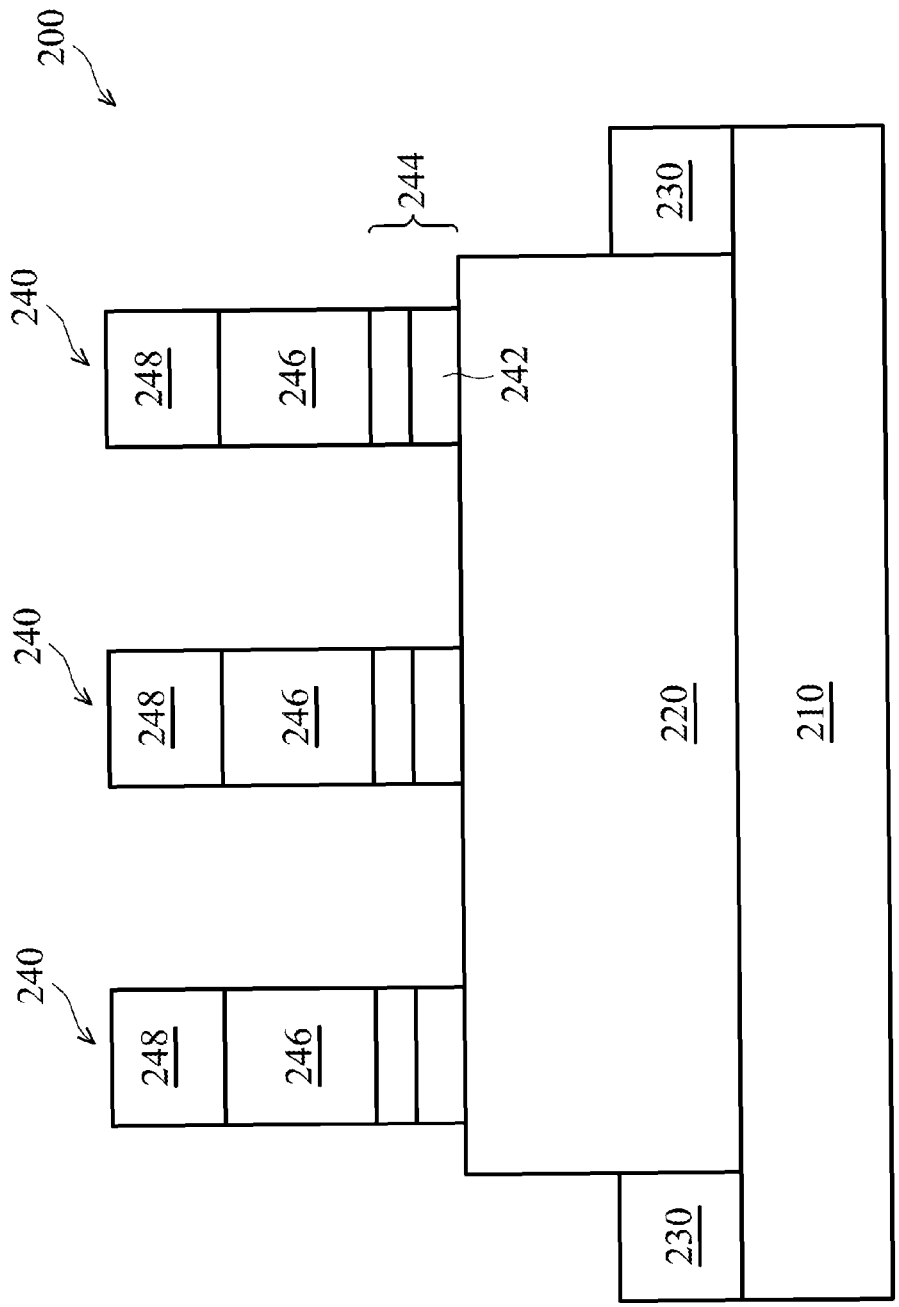
FIG. 3A illustrates a cross sectional view of a FinFET precursor along line A-A in FIG. 2.
Figure 3B:
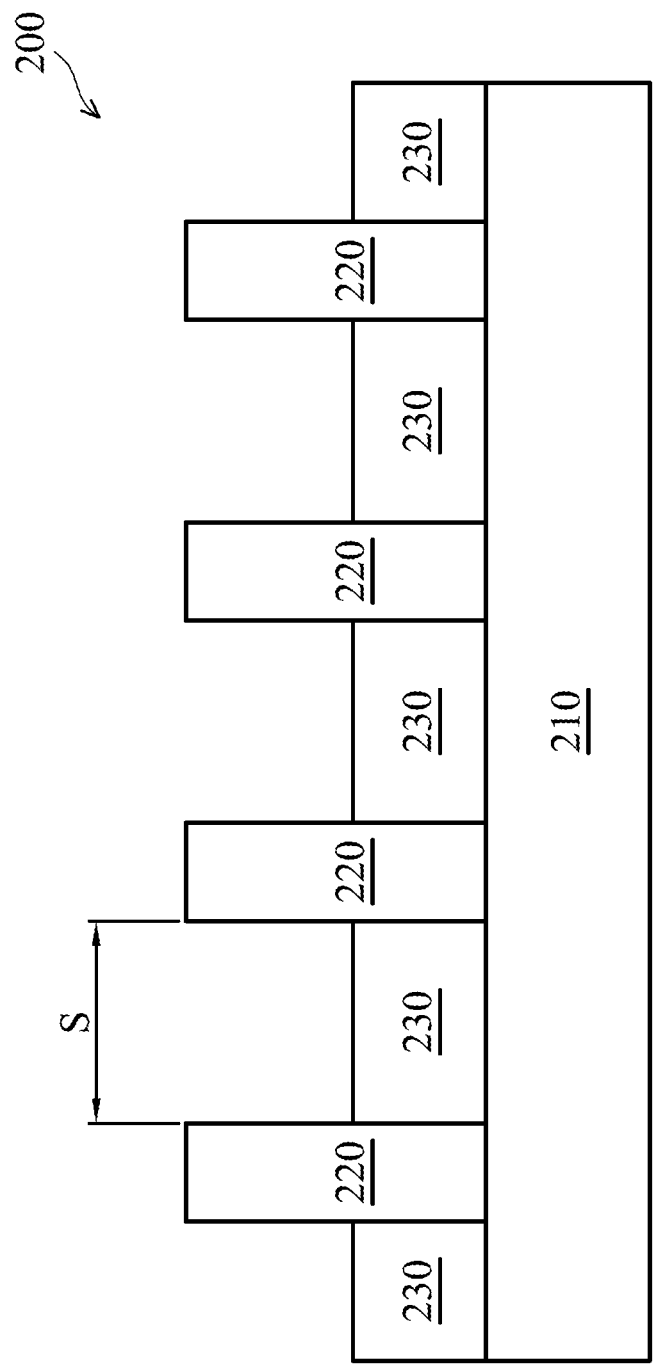
FIG. 3B illustrates cross sectional view of a FinFET precursor along line B-B in FIG. 2.

The method 100 begins at step 102 by receiving FinFET precursor 200, as shown in FIGS. 2, 3A and 3B. The FinFET precursor 200 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

A fin 220 is formed on the substrate 210. In some embodiments, the precursor 200 comprises more than one fin 220 with a spacing distance (S) to each other. The fin 220 is formed by any suitable process including various deposition, photolithography, and/or etching processes. An exemplary photolithography process includes forming a photoresist layer (resist) overlying the substrate (e.g., on a silicon layer), exposing the resist to a pattern, performing a post-exposure bake process, and developing the resist to form a masking element including the resist. The masking element is then used to etch the fin structure into the substrate 210. Areas not protected by the masking element are etched using reactive ion etching (RIE) processes and/or other suitable processes. In an example, the silicon fin 220 is formed by patterning and etching a portion of the silicon substrate 210. In another example, the fin 220 is formed by patterning and etching a silicon layer deposited overlying an insulator layer (for example, an upper silicon layer of a silicon-insulator-silicon stack of an SOI substrate). As an alternative to traditional photolithography, the fin 220 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fin structures 220 may be formed in a similar manner.

Isolation regions 230 are formed on the substrate 210 to isolate active regions of the substrate 210, and may be further used to separate the fins 220. The isolation region 230 may be formed using traditional isolation technology, such as shallow trench isolation (STI), to define and electrically isolate the various regions. The isolation region 230 comprises silicon oxide, silicon nitride, silicon oxynitride, an air gap, other suitable materials, or combinations thereof. The isolation region 230 is formed by any suitable process. As one example, the formation of an STI includes a photolithography process, an etch process to etch a trench in the substrate (for example, by using a dry etching and/or wet etching), and a deposition to fill in the trenches (for example, by using a chemical vapor deposition process) with one or more dielectric materials. The trenches may be partially filled, as in the present embodiment, where the substrate remaining between trenches forms a fin structure. In some examples, the filled trench may have a multi-layer structure such as a thermal oxide liner layer filled with silicon nitride or silicon oxide.

One or more gate stacks 240 are formed over the substrate 210, including over (wrapping) a portion of the fin 220. The gate stack 240 may include a dielectric layer 244, a gate electrode layer 246 and a hard mask layer 248. It is understood that the gate stack may include additional layers such as interfacial layers, capping layers, diffusion/barrier layers, dielectric layers, conductive layers, other suitable layers, and/or combinations thereof. For example, the dielectric 244 may include an interfacial layer (IL) 242 and a gate dielectric layer 243. The IL is formed over the substrate 210 and fins 220. The IL 242 is formed by any suitable process to any suitable thickness. An exemplary IL includes silicon oxide (e.g., thermal oxide or chemical oxide) and/or silicon oxynitride (SiON). The gate dielectric layer 243 is formed over the IL 242 by any suitable process. The gate dielectric layer 243 comprises a dielectric material, such as silicon oxide, silicon nitride, silicon oxynitride, high-k dielectric material, other suitable dielectric material, and/or combinations thereof. Examples of high-k dielectric material includes HfO2, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof.

The gate electrode layer 246 is formed over the dielectric layer 244 by any suitable process. The gate electrode layer 246 includes any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

The hard mask layer 248 is formed over the gate electrode layer 246 by any suitable process. The hard mask layer 248 includes any suitable material, for example, silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, and/or other suitable material.

The gate stack 240 is formed by any suitable process or processes. For example, the gate stack 240 can be formed by a procedure including deposition, photolithography patterning, and etching processes. The deposition processes include chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and ion-beam writing. The etching processes include dry etching, wet etching, and/or other etching methods (e.g., reactive ion etching).

In another embodiment, the gate stack 240 is a dummy gate stack and is replaced later by a metal gate (MG) after high thermal budget processes are performed. The dummy gate stack 240 may include the dielectric layer 244, the polysilicon layer 246 and the hard mask 248.

Figure 4A:
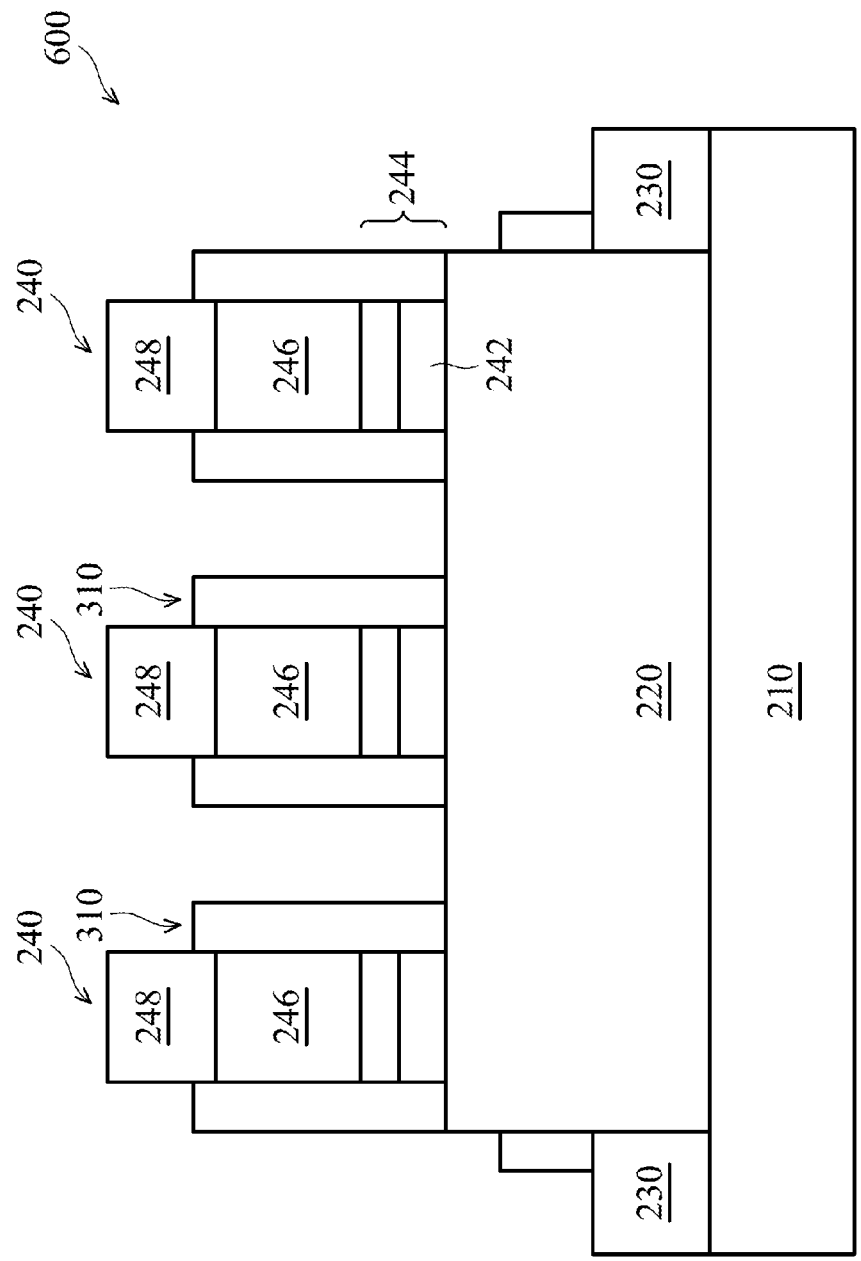
FIGS. 4A, 5A, 6A illustrate cross sectional views of a FinFET device along line A-A in FIG. 2.

Referring again to FIG. 1, once the FinFET precursor 200 is received, the method 100 proceeds to step 104 by forming a sidewall spacer 310 along the gate stack 240 and the fin 220, as shown in FIGS. 4A and 4B. The sidewall spacers 310 generally include a dielectric material such as silicon oxide. Alternatively, the sidewall spacers 310 may include silicon nitride, SiC, SiON, or combinations thereof. Typical formation methods for the sidewall spacers 310 include depositing a dielectric material over the gate stack 240 and the fin 220, and then anisotropically etching back the dielectric material. The etching back process may include a multiple-step etching to gain etch selectivity, flexibility and desired overetch control. In the present embodiment, a depth of etching back is controlled to achieve a predetermined fin-spacer-height (Hs). Here the Hs is defined as the spacer height along the fin 220. The Hs is adjustable by adjusting the etching back process, such as etching parameters of overetch. The Hs is designed to achieve target dimensions of a subsequent epitaxial structure, which will be described in details later.

Figure 5A:
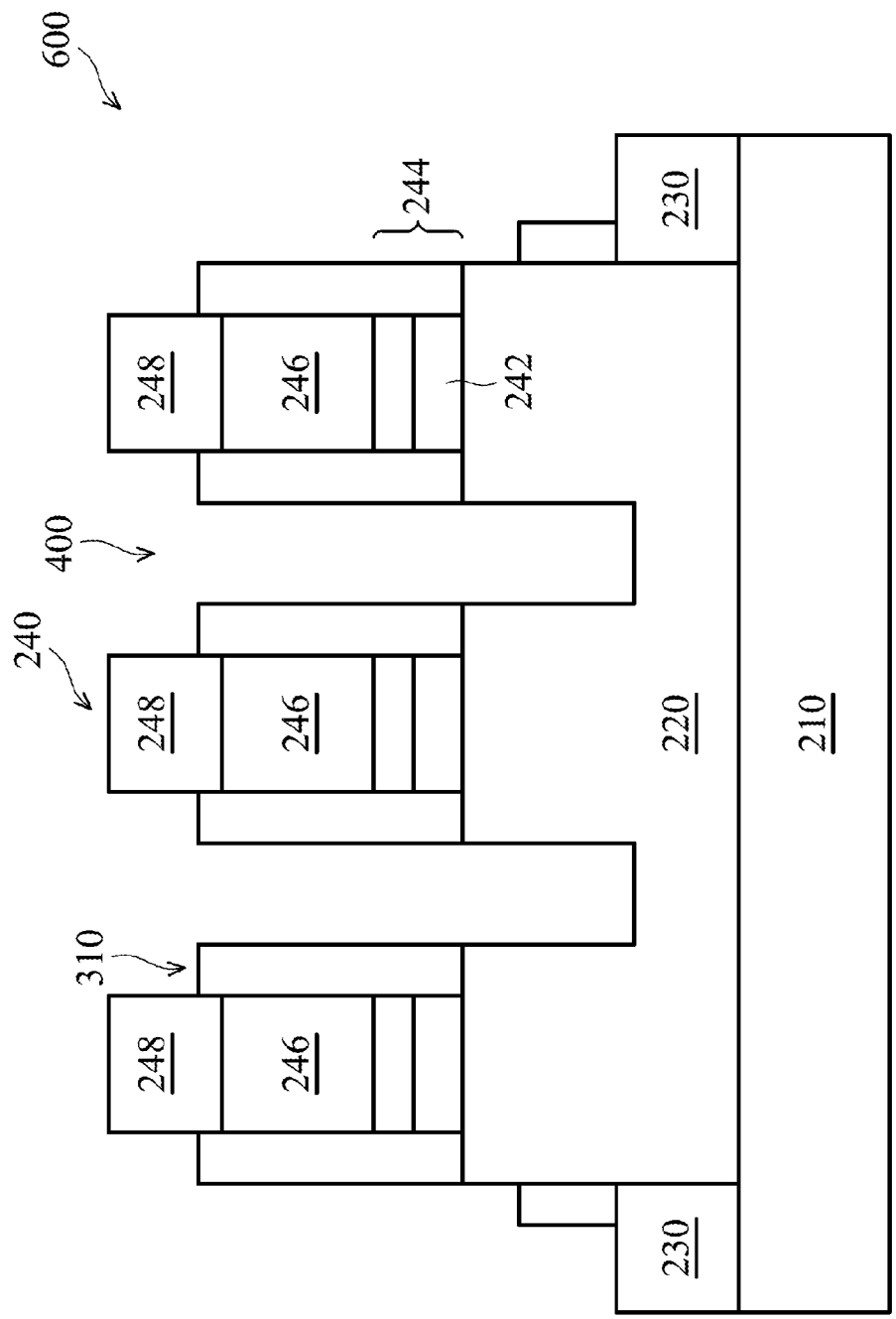
Figure 5B:
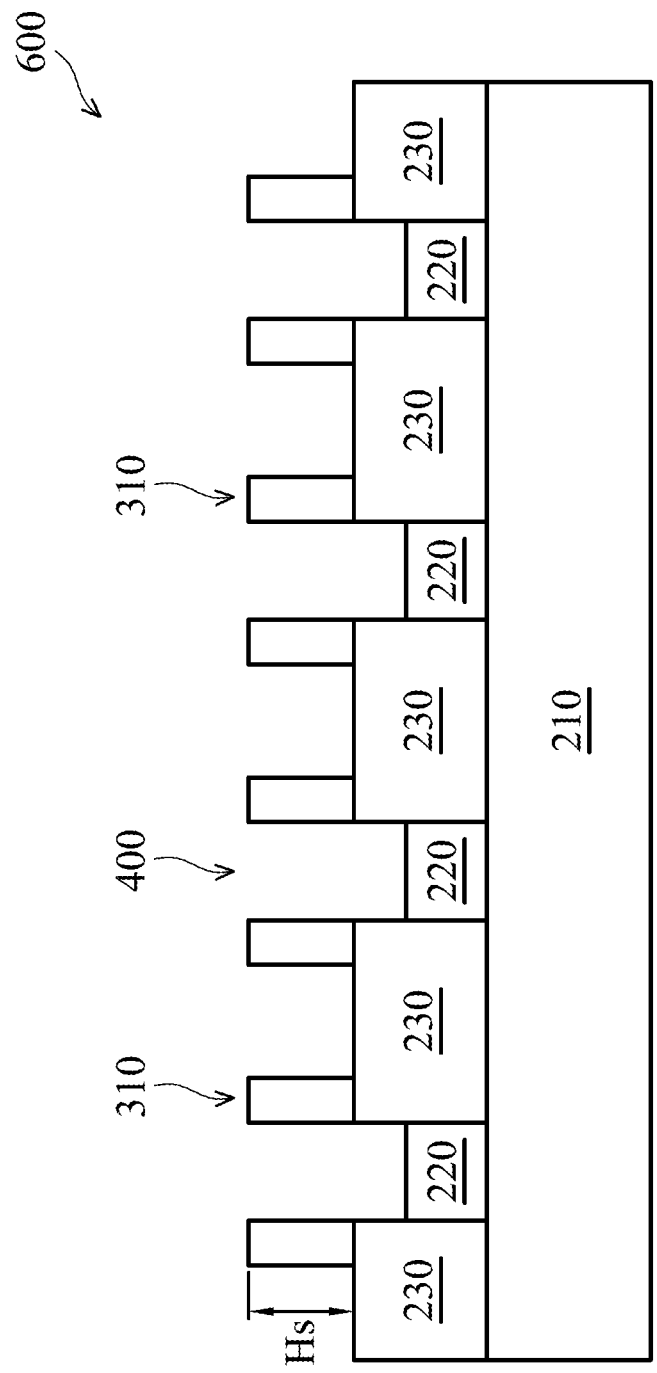

The method 100 proceeds to step 106 by recessing fins 220 to form a recessing trench 400, as shown in FIGS. 5A and 5B. In the depicted embodiment, the recessing trench 400 is formed with the sidewall spacer as its upper portion. In one embodiment, sidewalls of the recess trench 400 are substantially and vertical parallel to each other. In another embodiment, the recessing trench 400 is formed with a non-vertical parallel profile.

The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 6A:
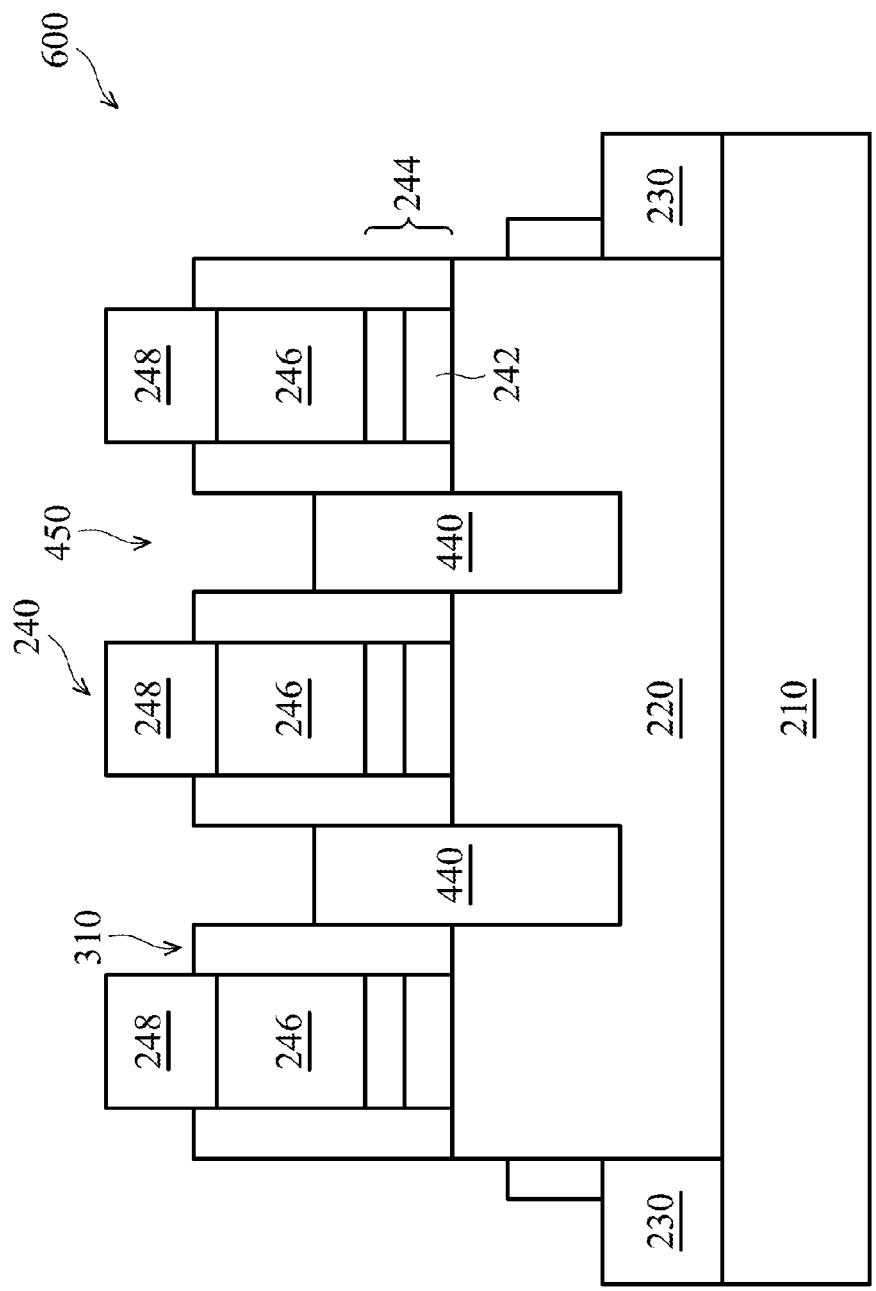
Figure 6B:
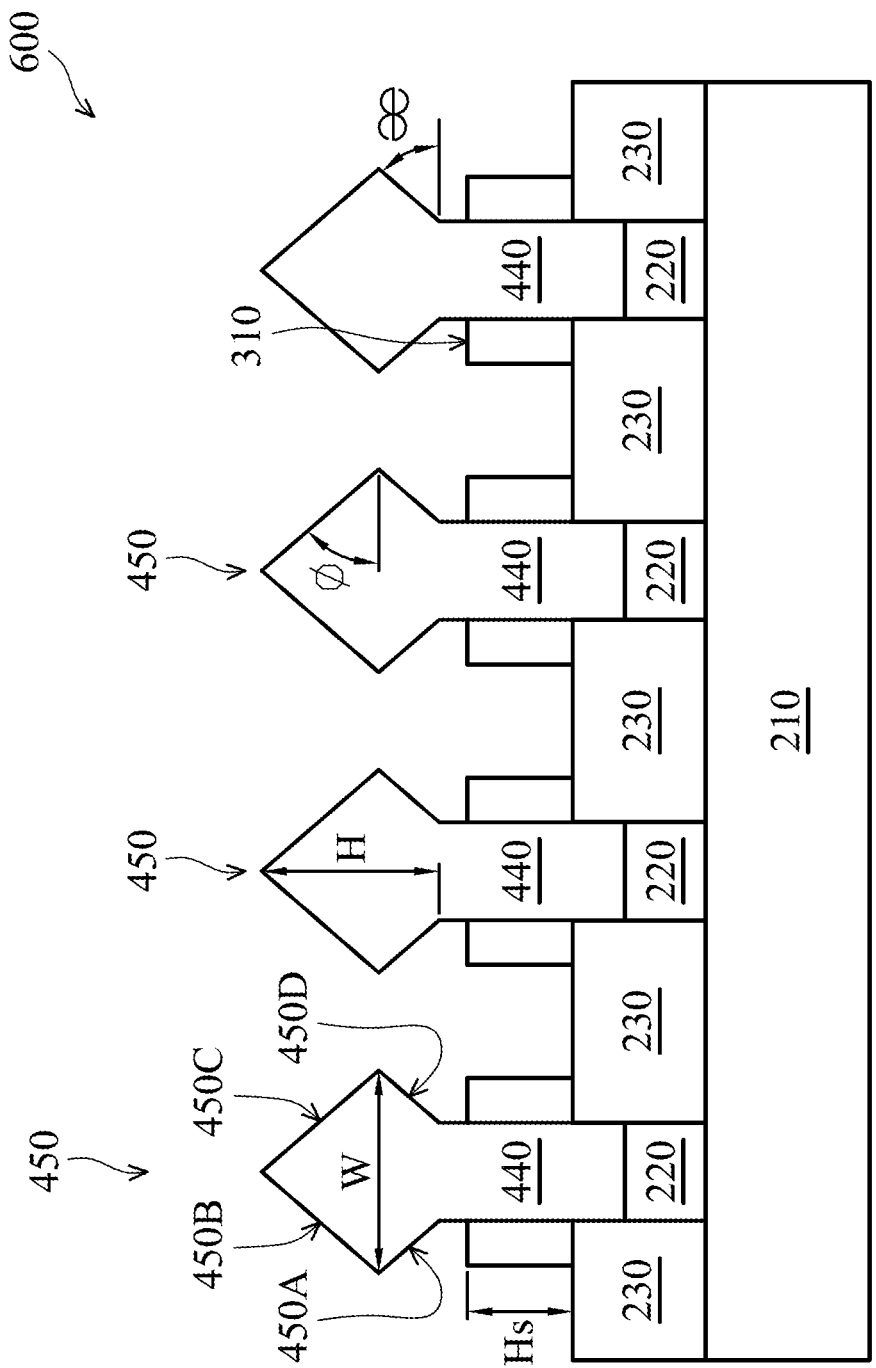

The method 100 proceeds to step 108 by forming epitaxial structures 450 above the recessing trench 400, as shown in FIGS. 6A and 6B. The epitaxial structures 450 are formed by epitaxially growing a semiconductor material 440. The semiconductor material 440 includes single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial structures 450 has any suitable crystallographic orientation (e.g., a (100), (110), or (111) crystallographic orientation). In on embodiment, the epitaxial structure 450 includes source/drain epitaxial structure. In an example, where an N-type FET (NFET) device is desired, the source/drain epitaxial structures 450 may include an epitaxially growing silicon (epi Si) 440. Alternatively, where a P-type FET (PFET) device is desired, epitaxial source/drain structures 450 may include an epitaxially growing silicon germanium (SiGe) 440.

The semiconductor material 440 epitaxilly grows on the recessed fins 220 in the recessing trench 400 and continually growing to above the recessing trench to form the epitaxial structure 450 with a height (H) and a width (W).

The epitaxial structures 450 may be formed by one or more epitaxy or epitaxial (epi) processes, such that one or more epitaxial features, such as Si features, SiGe features, and/or other suitable features can be formed in a crystalline state on the recessed fin 220. The epitaxial processes include CVD deposition techniques (e.g., vapor-phase epitaxy (VPE) and/or ultra-high vacuum CVD (UHV-CVD)), molecular beam epitaxy, and/or other suitable processes.

In one embodiment, the epitaxial structure 450 has four facets, 450A, 450B, 450C and 450D. Each facet has a (111) crystallographic orientation. The shape of the epitaxial structure 450 is similar to a rhombus shape, meaning that the facet 450A is parallel to the facet 450C and the facet 450B is parallel to the facet 450D. Facets 450A and 450D have a fixed angle (æ) with the surface of the isolation feature 220. Facets 450B and 450D have a fixed angle (φ) with a direction, which parallels with the surface of the isolation feature 220. As an example, the (angle φ) is 54.7 degree as well as the (angle æ).

Figure 7A:
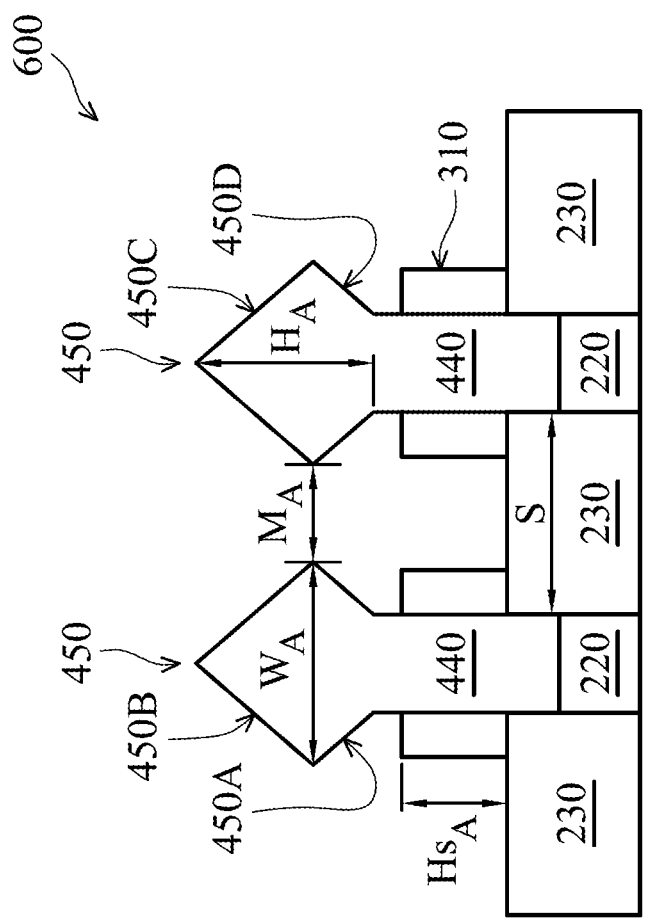
Figure 7B:
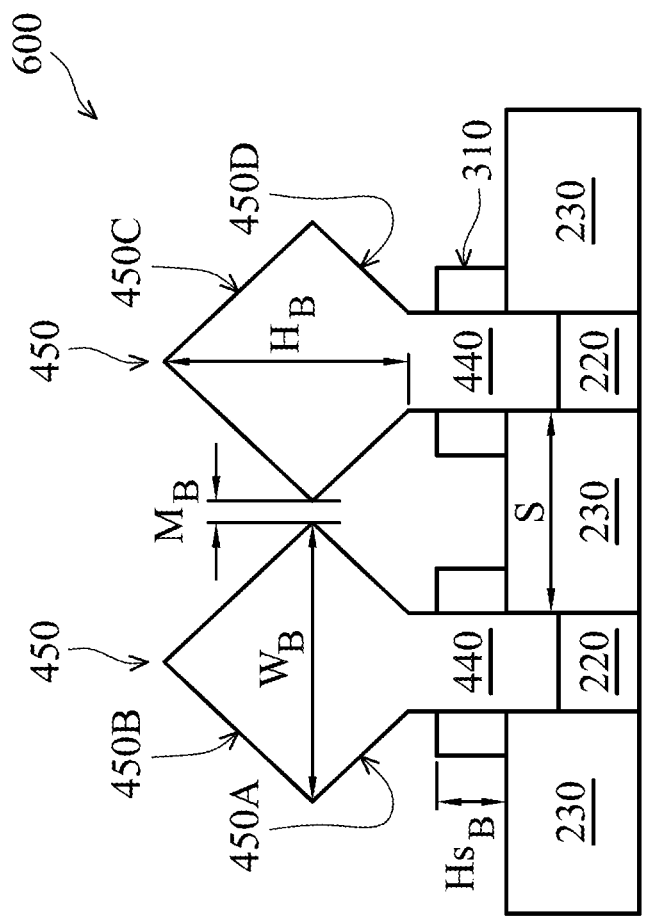
Figure 7C:
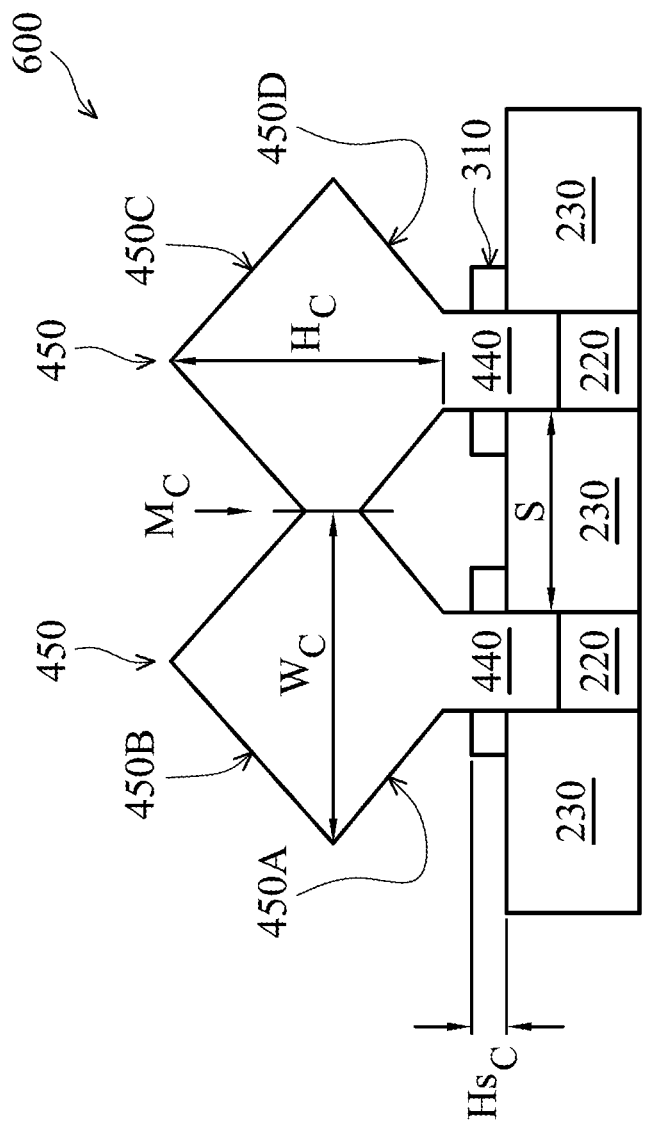

Referring to FIGS. 7A-7C, with a fixed spacing distance (S) between two adjacent fins 220, different fin-spacer-heights (Hs) may result in different H and W of the epitaxial structure 450 and also a different merging distance (M) between two adjacent epitaxial structure 450. Here, the M is defined as the distance between two nearest vertexes of two adjacent epitaxial structures 450. When two adjacent vertexes merge together, the M has a value from zero to a negative value. In one embodiment, where $Hs_A$ is larger than $Hs_B$ and $Hs_B$ is larger than $Hs_C$:

$M_A > M_B > M_C$ (which is a negative value),
$W_C > W_B > W_A$, and
$H_C > H_B > H_A$.

The epitaxial structures 450 may be in-situ doped or undoped during the epi process. For example, the epitaxially grown SiGe source/drain features 450 may be doped with boron; and the epitaxially grown Si epi source/drain features may be doped with carbon to form Si:C source/drain features, phosphorous to form Si:P source/drain features, or both carbon and phosphorous to form SiCP source/drain features. If the epitaxial structures 450 are not in-situ doped, a second implantation process (i.e., a junction implant process) is performed to dope the epitaxial structure 450. One or more annealing processes may be performed to activate source/drain epitaxial feature. The annealing processes comprise rapid thermal annealing (RTA) and/or laser annealing processes.

In one embodiment, the method 100 may further include removing the sidewall spacer 310 after the formation of the epitaxial structure 450. The sidewall spacer 310 may be removed by a selective etching process.

Additional steps can be provided before, during, and after the method 100, and some of the steps described can be replaced, eliminated, or moved around for additional embodiments of the method 100. For example, when forming the epitaxial structure 450 in a PMOS device, one or more layers, such as photoresist and dielectric layers are formed on the NMOS device as protection layers by deposition processes.

The FinFET device 600 may include additional features, which may be formed by subsequent processing. For example, various contacts/vias/lines and multilayer interconnect features (e.g., metal layers and interlayer dielectrics) may be formed over the substrate, configured to connect the various features or structures of the devices 600. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure offers methods for fabricating a FinFET device. The method employs tuning the height (H), width (W) and merging distance (M) of epitaxial structure by adjusting the fin-spacer-height (Hs). The method demonstrates to achieve a better control of the H, W and M of the epitaxial structure and improvement of FinFET device performance.

The present disclosure provides many different embodiments of fabricating a FinFET device that provide one or more improvements over the prior art. In one embodiment, a method for fabricating a FinFET device includes receiving a FinFET precursor which includes a substrate, fin structures with a spacing distance (S) to each other on the substrate and isolation regions separating fins on the substrate. The method also includes forming sidewall spacers with a predetermined spacer height (Hs) along sidewalls of the fin, recessing the fin to form a recessing trench with the sidewall spacers as an upper portion of the recessing trench and forming an epitaxial structure above the recessing trench with a height (H) and a width (W).

In another embodiment, a method for fabricating a FinFET device includes receiving a FinFET precursor which has a substrate, fin structures with a spacing distance (S) to each other on the substrate, isolation regions separating fins on the substrate and a gate stack on the substrate. The method also includes forming sidewall spacer with a predetermined spacer height (Hs) along the fin and the gate stack, removing a portion of the fin to form a recessing trench, wherein the recessing trench has the sidewall spacers as its upper portion, epitaxially growing a semiconductor material on the recessed fin in the recessing trench and continually growing to extend above the of the recessing trench to form an epitaxial structure.

In yet another embodiment, a method for fabricating a FinFET device includes receiving a FinFET precursor, which has a substrate, fin structures with a spacing distance (S) to each other on the substrate, isolation regions separating fins on the substrate and a gate stack on the substrate. The method also includes forming sidewall spacer with a predetermined spacer height (Hs) along the fin and the gate stack, removing a portion of the fin to form a recessing trench, wherein the recessing trench has the sidewall spacers as its upper portion and forming an epitaxial source/drain structure above the recessing trench, wherein a width (W) and a height (H) of the epitaxial source/drain structure are tunable by the Hs, wherein a merging spacing (M) between two adjacent epitaxial source/drain structure is tunable by the Hs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin field-effect transistor (FinFET) device, the method comprising:
    receiving a FinFET precursor, the FinFET precursor including:
        a substrate; and
        fin structures with a spacing distance (S) to each other on the substrate;
    forming sidewall spacers with a predetermined spacer height (Hs) along sidewalls of the fin structures;
    recessing the fin structures to form recessing trenches, wherein the sidewall spacers are upper portions of the recessing trenches; and
    forming an epitaxial structures above the recessing trenches with a height (H) and a width (W).

2. The method of claim 1, wherein the spacer height (Hs) is tunable by a spacer etching process.

3. The method of claim 1, wherein the epitaxial structures are formed by epitaxially growing a semiconductor material on the recessed fins in the recessing trenches, the epitaxial growth extending above the recessing trenches to form the epitaxial structures.

4. The method of claim 1, wherein the epitaxial structures are formed by multiple deposition processes with different semiconductor materials for each deposition process.

5. The method of claim 1, wherein W is tunable by Hs with a fixed S.

6. The method of claim 1, wherein H is tunable by Hs with a fixed S.

7. The method of claim 1, wherein a merging spacing (M) between two adjacent epitaxial structures is tunable by Hs with a fixed S.

8. The method of claim 1, wherein the epitaxial structures include a source/drain structure.

9. The method of claim 1, further comprising:
    after forming the epitaxial structure, removing the sidewall spacers by a selective etching process.

10. A method for fabricating a fin field-effect transistor (FinFET) device, the method comprising:
    receiving a FinFET precursor that includes:
        a substrate;
        a fin structure on the substrate, the fin structure including fins spaced from each other a spacing distance (S);
        isolation regions separating the fins; and
        a gate stack on the substrate;
    forming sidewall spacers with a predetermined spacer height (Hs) along a fin of the fin structure and the gate stack;
    removing a portion of the fin to form a recessing trench, wherein the sidewall spacers define an upper portion of the recessing trench;
    epitaxially growing a semiconductor material on the recessed fin in the recessing trench; and
    continually growing the semiconductor material to extend above the recessing trench to form an epitaxial structure.

11. The method of claim 10, wherein Hs is controlled by a spacer etching process.

12. The method of claim 1, wherein the epitaxial structure is formed with a width (W) such that is tunable by the Hs.

13. The method of claim 10, wherein the epitaxial structure is formed with a height (H) such that is tunable by Hs.

14. The method of claim 10, wherein the adjacent epitaxial structure is formed with a merging spacing (M) such that is tunable by Hs.

15. The method of claim 10, wherein the shape of the epitaxial structure has at least one facet of a crystal plane orientation.

16. The method of claim 15, wherein the crystal plane orientation is a (111) crystallographic orientation.

17. The method of claim 16, wherein the epitaxial structure has four facets and the four facets have the (111) crystallographic orientation.

18. The method of claim 10, wherein the epitaxial structure includes a source/drain structure.

19. The method of claim 10, wherein the epitaxial structure is formed by different semiconductor materials by performing multiple epitaxially growing processes.

20. A method for fabricating a fin field-effect transistor (FinFET) device, the method comprising:
    receiving a FinFET precursor that includes:
        a substrate;
        a fin structure on the substrate, the fin structure including fins spaced from each other a spacing distance (S);
        isolation regions separating the fins; and
        a gate stack on the substrate;
    forming sidewall spacers with a predetermined spacer height (Hs) along the fins and the gate stack;
    removing a portion of the fins to form recessing trenches, wherein each of the recessing trenches includes the sidewall spacers as an upper portion; and
    forming an epitaxial source/drain structures above the recessing trenches, wherein a width and a height of the epitaxial source/drain structures are tunable by Hs, wherein a merging spacing between two adjacent epitaxial source/drain structures is tunable by Hs.

* * * * *